(12) United States Patent
Woods, Jr. et al.

(10) Patent No.: US 8,405,453 B2
(45) Date of Patent: Mar. 26, 2013

(54) MILLIMETER-WAVE ON-CHIP SWITCH EMPLOYING FREQUENCY-DEPENDENT INDUCTANCE FOR CANCELLATION OF OFF-STATE CAPACITANCE

(75) Inventors: Wayne H. Woods, Jr., Burlington, VT (US); Guoan Wang, Burlington, VT (US); Hanyi Ding, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 12/839,777

(22) Filed: Jul. 20, 2010

(65) Prior Publication Data

US 2012/0019313 A1    Jan. 26, 2012

(51) Int. Cl.
 H03K 5/00 (2006.01)
 H01L 27/24 (2006.01)
(52) U.S. Cl. ........................ 327/553; 333/103
(58) Field of Classification Search ............... 333/103, 333/101, 262, 104; 327/365, 376, 552–559
 See application file for complete search history.

(56) References Cited

U.S. PATENT DOCUMENTS

| | | | |
|---|---|---|---|
| 4,789,846 A * | 12/1988 | Matsunaga et al. | 333/104 |
| 5,032,738 A | 7/1991 | Vithayathil | |
| 5,485,130 A * | 1/1996 | Nakahara et al. | 333/104 |
| 6,118,985 A * | 9/2000 | Kawakyu et al. | 455/78 |
| 6,438,394 B1 | 8/2002 | Zhang et al. | |
| 6,529,750 B1 | 3/2003 | Zhang et al. | |
| 6,608,736 B1 | 8/2003 | Klaassen et al. | |
| 7,190,239 B2 | 3/2007 | Fujimoto et al. | |
| 7,633,357 B2 * | 12/2009 | Hangai et al. | 333/103 |
| 2005/0007213 A1 | 1/2005 | Nakajima et al. | |
| 2006/0132258 A1 | 6/2006 | Ogle | |
| 2006/0232348 A1 | 10/2006 | Hino | |
| 2007/0123176 A1 | 5/2007 | Han et al. | |
| 2010/0225376 A1* | 9/2010 | Tsukahara | 327/416 |

FOREIGN PATENT DOCUMENTS

DE    10063606 A1    7/2001

OTHER PUBLICATIONS

Huang et al., "Direct Synthesis of Tubular Bandpass Filters With Frequency-Dependent Inductors", 1998, IEEE MTT-S Digest, , pp. 371-374.

D. Zhang et al., "Narrowband Lumped-Element Microstrip Filters Using Capacitively-Loaded Inductors", Dec. 1995, IEEE Transactions on Microwave Theory and Techniques, vol. 43, No. 12, pp. 3030-3036.

(Continued)

Primary Examiner — Dinh T. Le
(74) Attorney, Agent, or Firm — Scully, Scott, Murphy & Presser, P.C.; Anthony J. Canale

(57) ABSTRACT

A semiconductor switching device includes a field effect transistor and an inductor structure that provides a frequency dependent inductance in a parallel connection. During the off-state of the semiconductor switching device, the frequency dependent impedance component due to the off-state parasitic capacitance of the switching device is cancelled by the frequency dependent inductance component of the inductor structure, which provides a non-linear impedance as a function of frequency. The inductor structure provides less inductance at a higher operating frequency than at a lower operating frequency to provide more effective cancellation of two impedance components of the parasitic capacitance and the inductance. Thus, the semiconductor switching device can provide low parasitic coupling at multiple operating frequencies. The operating frequencies of the semiconductor switching device can be at gigahertz ranges for millimeter wave applications.

25 Claims, 11 Drawing Sheets

OTHER PUBLICATIONS

D. Zhang et al., "Narrowband Lumped-Element Microstrip Filters Using Capacitively-Loaded Inductors", Dec. 1995, IEEE MIT-S Digest (WE1C1) pp. 379-382.

* cited by examiner

MILLIMETER-WAVE ON-CHIP SWITCH EMPLOYING FREQUENCY-DEPENDENT INDUCTANCE FOR CANCELLATION OF OFF-STATE CAPACITANCE

BACKGROUND

The present disclosure relates to a structure including a switching device including a transistor and an on-chip inductor with frequency-dependent inductance.

Millimeter wave refers to the spectral range of electromagnetic radiation in which the wavelength of the electromagnetic radiation is from 1.0 mm to 10 mm in vacuum. This range of electromagnetic radiation corresponds to the frequency range from 30 GHz to 300 GHz, which is also referred to as extremely high frequency (EHF) range. This range of frequency is considered to be the highest radio frequency band, above which the electromagnetic radiation is considered to be far infrared light. Millimeter waves are employed for broadband internet access including wireless communications.

On-chip switches for operation at millimeter wave range, i.e., in the EHF range, are highly in demand for many applications including digital and analog applications. These on-chip switches employ a transistor, which is typically a field effect transistor to provide low on-state resistance to provide a low-loss signal transmission path. However, the transistor employed as the on-chip switch typically has a significant off-state capacitance, which provides a parasitic capacitance sufficiently high to couple an input signal to capacitively couple to the output node of the on-chip switch. In order to prevent the capacitive coupling of the signal between the input node and the output node in the off-state, conventional on-chip switches include an inductor connected in parallel with the capacitor between the input node and the output node of the on-chip switch.

Referring to FIG. 1A, a first prior art circuit represents a prior art on-chip switch. The first prior art circuit includes a field effect transistor T and a fixed inductance inductor having an inductance of L that are connected in a parallel connection between a first node N1 and a second node N2. For example, the first node N1 can be an input node and the second node N2 can be an output node.

Referring to FIG. 1B, a second prior art circuit represents the prior art on-chip switch of FIG. 1A as a set of interconnected equivalent electronic components. The field effect transistor T of the first prior art circuit is represented by a combination of an ideal switch S, a parasitic resistor having the on-state resistance of the transistor $R_{on}$, and a parasitic capacitor having the off-state capacitance $C_{off}$. The on-state impedance of the first and second prior art circuits, i.e., the effective impedance $Z_{eff}$ of the first and second prior art circuits while the transistor T is turned on, is equal to the on-state resistance of the transistor $R_{on}$. The off-state impedance of the first and second prior art circuits, i.e., the effective impedance $Z_{eff}$ of the second prior art circuit while the transistor T is turned off, is given by:

$$Z_{eff} = j2\pi\left(\frac{fL}{1-4\pi^2 f^2 LC_{off}}\right). \quad \text{(Eq. 1)}$$

In order to maximize the off-state capacitance of the second prior art circuit at an optimal operating frequency of $f_0$, the value of the inductance L needs to be:

$$L = \frac{1}{4\pi^2 f_0^2 C_{off}}. \quad \text{(Eq. 2)}$$

In other words, the effective impedance $Z_{eff}$ of the second prior art circuits diverges to infinity when the value of the inductance L satisfies (Eq. 2). In this case, the effective impedance $Z_{eff}$ of the second prior art circuit at a general operating frequency f while the transistor T is turned off is given by:

$$Z_{eff} = \frac{j}{2\pi f_0 C_{off}}\left(\frac{f/f_0}{1-f^2/f_0^2}\right). \quad \text{(Eq. 3)}$$

When the operating frequency f is at the optimal operating frequency of $f_0$, the effective impedance $Z_{eff}$ of the second prior art circuit diverges to infinity. In this case, the second prior art circuit provides a complete decoupling between the first node N1 and the second node N2. When the operating frequency f deviates from the optimal operating frequency of $f_0$, however, the effective impedance $Z_{eff}$ of the second prior art circuit becomes a finite number.

For example, a prior art switching circuit designed to operate at 60 GHz may be subjected to operation at 54 GHz or at 66 GHz. In an illustrative example, if a sub-optimal operating frequency is selected to be 0.9 times the optimal operating frequency, as in the case of operation at 54 GHz of a circuit optimized for 60 GHz operation, the frequency ratio $f/f_0$ is 0.9, and the effective impedance $Z_{eff}$ of the second prior art circuit is given by:

$$Z_{eff} \cong \frac{4.74j}{2\pi f_0 C_{off}}. \quad \text{(Eq. 4)}$$

In another illustrative example, if a supra-optimal operating frequency is selected to be 1.1 times the optimal operating frequency, as in the case of operation at 66 GHz of a circuit optimized for 60 GHz operation, the frequency ration $f/f_0$ is 1.1, and the effective impedance $Z_{eff}$ of the second prior art circuit is given by:

$$Z_{eff} \cong -\frac{5.24j}{2\pi f_0 C_{off}}. \quad \text{(Eq. 5)}$$

Thus, when the operating frequency of the prior art on-chip switch represented by the first and second prior art circuits of FIGS. 1A and 1B deviates from the optimal operating frequency, the net effect is a coupling across the first node N1 and the second node that has a magnitude of about one fifth of the uncompensated off-state capacitive coupling due to the parasitic capacitor having the off-state capacitance $C_{off}$. The coupling is capacitive if the operating frequency is sub-optimal, and is inductive if the operating frequency is supra-optimal. Thus, the parasitic coupling across the first node N1 and the second node N2 at non-optimal frequencies severely limit the operation of the prior art on-chip switch at multiple operating frequencies.

Many semiconductor applications require, however, multiple operating frequencies. In such circuits, it is desirable for an on-chip switch to provide high quality signal isolation during an off-state without a significant amount of signal coupling across the input node and the output node at multiple operating frequencies.

BRIEF SUMMARY

The present disclosure provides a structure including a switching device and an on-chip inductor having multiple frequency-dependent inductance ranges.

A semiconductor switching device includes a transistor and an inductor structure that provides a frequency dependent inductance in a parallel connection. During the off-state of the semiconductor switching device, the frequency dependent impedance component due to the off-state parasitic capacitance of the switching device is cancelled by the frequency dependent inductance component of the inductor structure, which provides a non-linear impedance as a function of frequency. The inductor structure provides less inductance at a higher operating frequency than at a lower operating frequency to provide more effective cancellation of two impedance components of the parasitic capacitance and the inductance. Thus, the semiconductor switching device can provide low parasitic coupling at multiple operating frequencies. The operating frequencies of the semiconductor switching device can be at gigahertz ranges for millimeter wave applications.

The inductor structure provides at least two different inductance values, each corresponding to a different signal frequency. The at least two different inductance values are selected to cancel different values of the frequency-dependent parasitic impedance due to the parasitic capacitance of the transistor. Thus, the cancellation of the capacitive impedance and the inductive impedance occurs at multiple operating frequencies so that the semiconductor switching device provides high quality signal isolation at multiple operating frequencies.

As the inductor structure, a set of metal line structures can be employed, which includes a signal transmission metal line, a grounded inductively coupled metal line, and a capacitively-grounded inductively-signal-coupled metal line that are embedded in a dielectric material layer. The grounded inductively coupled metal line is grounded at the input signal side and at the output signal side. A capacitor is serially connected between the capacitively-grounded inductively-signal-coupled metal line and a local electrical ground, which may be on the input side or on the output side. The substrate has a finite resistance between a first local ground at the signal input side and a second local ground at the signal output side.

At a low frequency, the capacitor electrically disconnects the capacitively-grounded inductively-signal-coupled metal line from the local electrical ground, thereby inhibiting an inductive coupling between the signal transmission metal line and the capacitively-grounded inductively-signal-coupled metal line. At a high frequency, the capacitor electrically connects the capacitively-grounded inductively-signal-coupled metal line to the local electrical ground, thereby enabling the inductive coupling between the signal transmission metal line and the capacitively-grounded inductively-signal-coupled metal line.

The set of metal line structures and the capacitor collective provide a frequency dependent inductor. The Q factor of the frequency dependent inductor has multiple peaks that enable the operation of the frequency dependent inductor at multiple frequencies.

Multiple capacitively-grounded inductively-signal-coupled metal lines may be provided in the frequency-dependent inductor, each of which is connected to the local electrical ground through a capacitor. By selecting different capacitance values for the capacitors, multiple values of the Q-factor may be obtained in the frequency dependent inductor at different signal frequencies. A semiconductor circuit incorporating such a semiconductor structure is also provided.

According to an aspect of the present disclosure, a semiconductor structure is provided, which includes a switching device and an inductor structure, wherein a first node of the inductor structure is electrically connected to an input node of the switching device and a second node of the inductor structure is electrically connected to an output node of the switching device, wherein the inductor structure has a frequency-dependent inductance.

According to another aspect of the present disclosure, a semiconductor circuit is provided, which includes a switching device and an inductor having a frequency-dependent inductance, wherein a first node of the inductor structure is electrically connected to an input node of the switching device and a second node of the inductor structure is electrically connected to an output node of the switching device.

According to yet another aspect of the present disclosure, a non-transitory machine readable medium embodying a design structure is provided. The design structure includes: a first data representing a switching device; and a second data representing an inductor structure, wherein a first node of the inductor structure is electrically connected to an input node of the switching device and a second node of the inductor structure is electrically connected to an output node of the switching device, wherein the inductor structure has a frequency-dependent inductance.

DETAILED DESCRIPTION

Figure 1A:
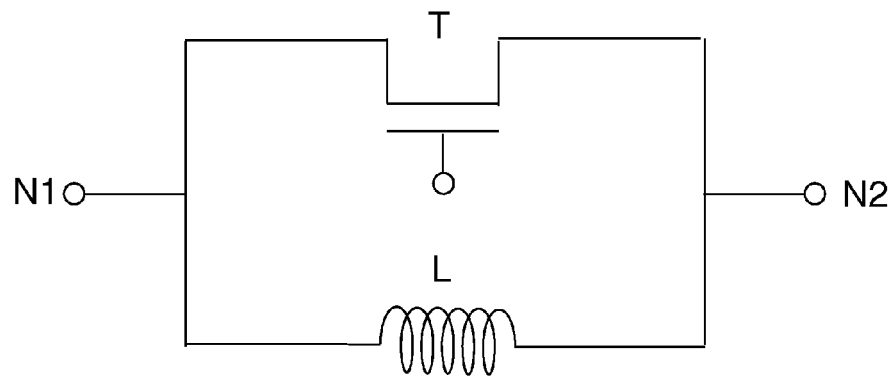
FIG. 1A is a first prior art circuit that includes an on-chip switch and an inductor.
Figure 1B:
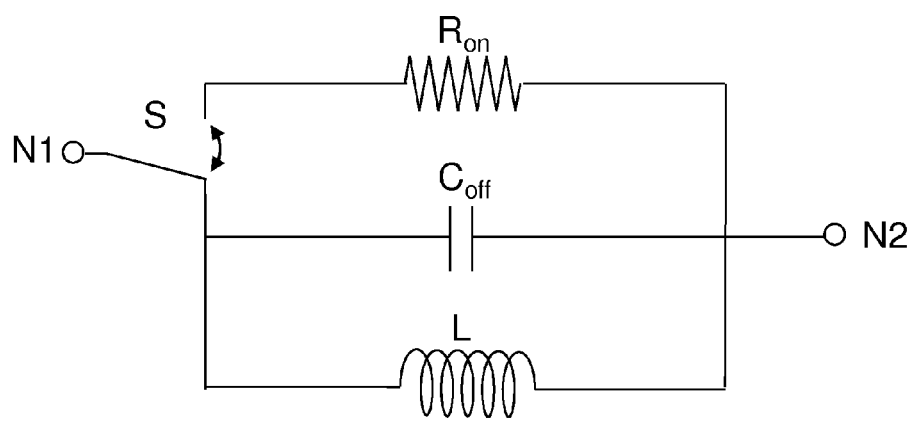
FIG. 1B is a second prior art circuit that represents the prior art on-chip switch of FIG. 1A as a set of interconnected equivalent electronic components.

As stated above, the present disclosure relates to a structure including a switching device including a transistor and an on-chip inductor with frequency-dependent inductance, a circuit for the same, and a non-transitory machine readable medium for the same, which are described herein with accompanying figures. As used herein, when introducing elements of the present disclosure or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present disclosure have been omitted for clarity. The drawings are not necessarily drawn to scale.

As used herein, a structural element is referred to as being "on" another structural element when the structural element is located directly on the other structural element or when a set of at least one intervening element making direct physical contact with the structural element and the other structural element is present. A structural element is referred to as being "directly on" another structural element when there is no intervening structural element and a physical contact is formed between the structural element and the other structural element. Likewise, an element is referred to as being "connected" or "coupled" to another element when the element is directly connected or coupled to the other element or when a set of at least one intervening element provides connection or coupling with the element and the other element. An element is referred to as being "directly connected" or "directly coupled" to another element when there is no intervening element and the connection or coupling is provided between the element and the other element. An element "abuts" another element when a physical interface area providing a direct contact is present between the element and the other element. A "frequency-dependent" inductance refers to a non-constant inductance, i.e., an inductance that has different values as a function of the signal frequency.

As used herein, a first node of a circuit is "electrically connected to" a second node of the circuit is the voltage at the first node is necessarily the same as the voltage at the second node under all operating conditions of the circuit.

Figure 2A:
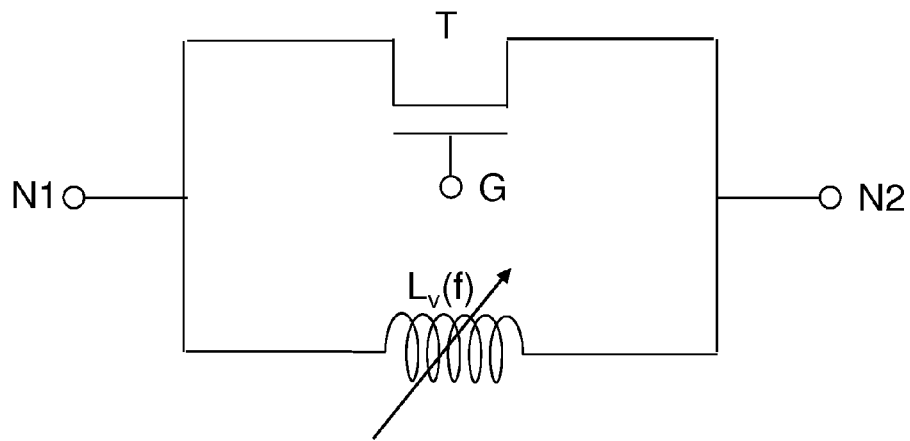
FIG. 2A is a circuit representing a semiconductor structure including a switching device and a variable inductance inductor in a parallel connection between a first node N1 and a second node N2 according to the present disclosure.

Referring to FIG. 2A, a circuit representing an on-chip switch is shown according to an embodiment of the present disclosure. The circuit includes a switching device and a variable inductance inductor having a variable inductance $L_v(f)$, i.e., a frequency-dependent inductance. For example, the switching device can be a field effect transistor T. The field effect transistor T can be replaced with any other semiconductor device capable of providing a switching function. For example, the field effect transistor T can be replaced with a bipolar junction transistor or a nanoscale switching device such as a carbon nanotube-based switching device. The switching device and the variable inductance inductor are connected in a parallel connection between a first node N1 and a second node N2. For example, the first node N1 can be an input node and the second node N2 can be an output node.

The first node N1 can be an input node of the switching device, and the second node N2 can be an output node of the switching device. The switching device can be provided with a control node G, which can be physically implemented as a gate electrode in case the switching device is a field effect transistor. A first node of the inductor structure is electrically connected to the input node of the switching device and a second node of the inductor structure is electrically connected to the output node of the switching device.

In case the switching device is a field effect transistor T, the field effect transistor T can be configured to transmit or electrically isolate a signal at a frequency greater than 30 GHz, i.e., to act as a switch for a frequency range for millimeter wave or an infrared radiation. In this case, the first node N1 can be electrically connected to one of a source and a drain of the field effect transistor T, and the second node N2 can be electrically connected to the other of the source and the drain of the field effect transistor T.

Figure 2B:
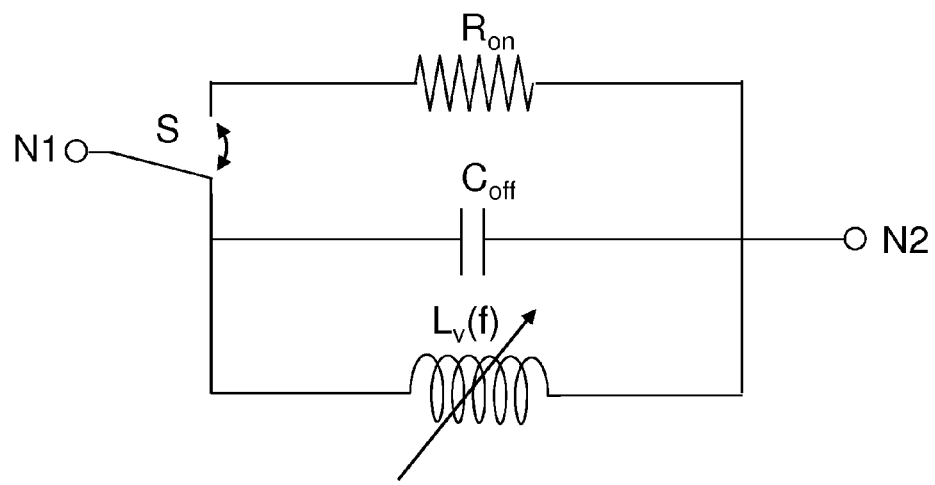
FIG. 2B is a circuit representing equivalent components of the semiconductor structure of FIG. 2A according to the present disclosure.

Referring to FIG. 2B, an equivalent circuit represents the on-chip switch of FIG. 2A as a set of interconnected equivalent electronic components. The switching device of the circuit of FIG. 2A can be represented by a combination of an ideal switch S, a parasitic resistor having the on-state resistance of the transistor $R_{on}$, and a parasitic capacitor having the off-state capacitance $C_{off}$. The on-state impedance of the equivalent circuit, i.e., the effective impedance $Z_{eff}$ of the equivalent circuit while the switching device is turned on, is equal to the on-state resistance of the switching device $R_{on}$. The off-state impedance of the equivalent circuit, i.e., the effective impedance $Z_{eff}$ of the equivalent circuit while the switching device is turned off, is give by:

$$Z_{eff} = j2\pi\left(\frac{fL_v(f)}{1 - 4\pi^2 f^2 L_v(f)C_{off}}\right). \quad \text{(Eq. 6)}$$

In order to maximize the off-state capacitance of the second prior art circuit at an optimal operating frequency of $f_0$, the value of the variable inductance $L_v(f)$ at the optimal operating frequency $f_0$ needs to be given by:

$$L_v(f_0) = \frac{1}{4\pi^2 f_0^2 C_{off}}. \quad \text{(Eq. 7)}$$

In other words, the effective impedance $Z_{eff}$ of the equivalent circuits diverges to infinity when the value of the inductance L satisfies (Eq. 7). In this case, the effective impedance $Z_{eff}$ of the equivalent circuit at a general operating frequency f while the transistor T is turned off is given by:

$$Z_{eff} = \frac{j}{2\pi f_0 C_{off}} \left( \frac{fL_v(f)/f_0 L_v(f_0)}{1 - f^2 L_v(f)/f_0^2 L_v(f_0)} \right).$$ (Eq. 8)

When the operating frequency f is at the optimal operating frequency of $f_0$, the effective impedance $Z_{eff}$ of equivalent circuit diverges to infinity. In this case, the circuit of FIG. 2A provides a complete decoupling between the first node N1 and the second node N2.

In the instant disclosure, the variable inductance $L_v(f)$ is a non-constant function of the frequency f. Particularly, the variable inductance $L_v(f)$ is selected such that the following equation has at least one more value of f other than f0:

$$1 - f^2 L_v(f)/f_0^2 L_v(f_0) = 0.$$ (Eq. 9)

In other words, the following equation has at least one solution for the frequency f at a frequency other than $f_0$.

$$L_v(f)/L_v(f_0) = f_0^2/f^2$$ (Eq. 10)

The condition of Eq. 9 or Eq. 10 corresponds to an operating frequency f at which an inductive impedance component due to the frequency-dependent inductance, i.e., the variable inductance $L_v(f)$, matches a capacitive impedance component $Z_{cap}$ due to a parasitic capacitance of the switching device, which is given by:

$$Z_{cap} = \frac{j}{2\pi f C_{off}}.$$ (Eq. 11)

In order for a plurality of solutions for the frequency f to exist for Eq. 9 and Eq. 10 at a plurality of frequencies, the variable inductance $L_v(f)$ needs to have at least two frequencies at which the variable inductance $L_v(f)$ at a higher frequency is lesser than the variable inductance $L_v(f)$ at a lower frequency. The frequencies that are solutions for Eq. 9 and Eq. 10 are herein referred to as a plurality of solution frequencies. The plurality of solution frequencies includes a first frequency and a second frequency that is greater than the first frequency, and the frequency-dependent inductance is greater at the first frequency than at the second frequency.

Figure 3:
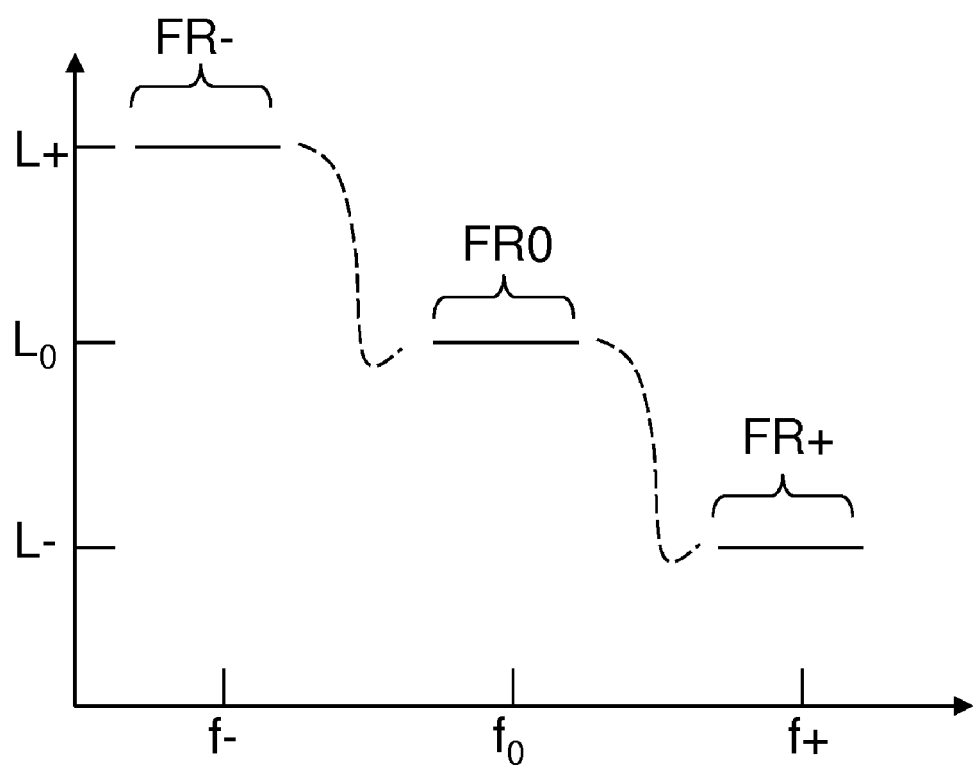
FIG. 3 is a graph schematically representing the frequency-dependent inductance of the variable inductor according to the present disclosure.

Referring to FIG. 3, an exemplary curve for the variable inductance $L_v(f)$ is illustrated as a function of signal frequency. Each solid portion of the curve for the variable inductance $L_v(f)$ represents a frequency range in which the value of the variable inductance $L_v(f)$ varies slowly with frequency, and each dotted portion of the curve for the variable inductance $L_v(f)$ represents a frequency range in which the value of the variable inductance $L_v(f)$ varies with frequency. The variable inductance $L_v(f)$ can vary smoothly with frequency, and can include monotonically changing portions. The variable inductance $L_v(f)$ has a first operating range around an optimal operating frequency $f_0$, at which the value of the variable inductance $L_v(f)$ is $L_0$. By selecting the value of $L_0$ to be the same as the value of the variable inductance $L_v(f_0)$ given by Eq. 7, the impedance of the circuit of FIG. 2A diverges to infinity at the optimal operating frequency $f_0$. While the switching device such as the field effect transistor T is turned off, the effective impedance $Z_{eff}$ of the circuit of FIG. 2A remains high within a first optimal frequency range around the optimal operating frequency $f_0$ (represented by a solid portion of the curve marked FR0), and the circuit of FIG. 2A functions as an effective switch with minimal signal coupling between the first node N1 and the second node N2 when the frequency of the signal is within the first optimal frequency range.

The variable inductance $L_v(f)$ has at least another operating range above the optimal operating frequency $f_0$, such as a frequency range around an upper optimal operating frequency f+, or below the optimal operating frequency $f_0$, such as a frequency range around a lower optimal operating frequency f−. At the upper and/or lower optimal operating frequencies (f+ and/or f−), Eq. 9 and Eq. 10 are satisfied. Thus, the effective impedance $Z_{eff}$ of the equivalent circuit while the transistor T is turned off, as given by Eq. 8, diverges to infinity at the upper and/or lower optimal operating frequency. While the switching device such as the field effect transistor T is turned off, the effective impedance $Z_{eff}$ of the circuit of FIG. 2A remains high within each optimal frequency range around the upper and/or lower optimal operating frequencies (represented by solid portions of the curve marked FR+ and FR−), and the circuit of FIG. 2A functions as an effective switch with minimal signal coupling between the first node N1 and the second node N2 when the frequency of the signal is within any of the optimal frequency ranges around the optimal operating frequency f+ or around the lower optimal operating frequency f−.

In one embodiment, the on-chip switch represented by the circuits of FIGS. 2A and 2B can provide multiple optimal signal switching frequency ranges in which the effective impedance $Z_{eff}$ of the circuit of FIG. 2A is high and any inductive or capacitive coupling between the first node N1 and the second node N2 is minimized. The multiple frequency ranges that provide high impedance between the first node N1 and the second node N2 can be advantageously employed to enable signal switching at the corresponding multiple frequency ranges for the purpose of signal processing.

Embodiments in which more than three frequency ranges exist at which the effective impedance $Z_{eff}$ of the circuit of FIG. 2A is high are also contemplated herein.

Figure 4:
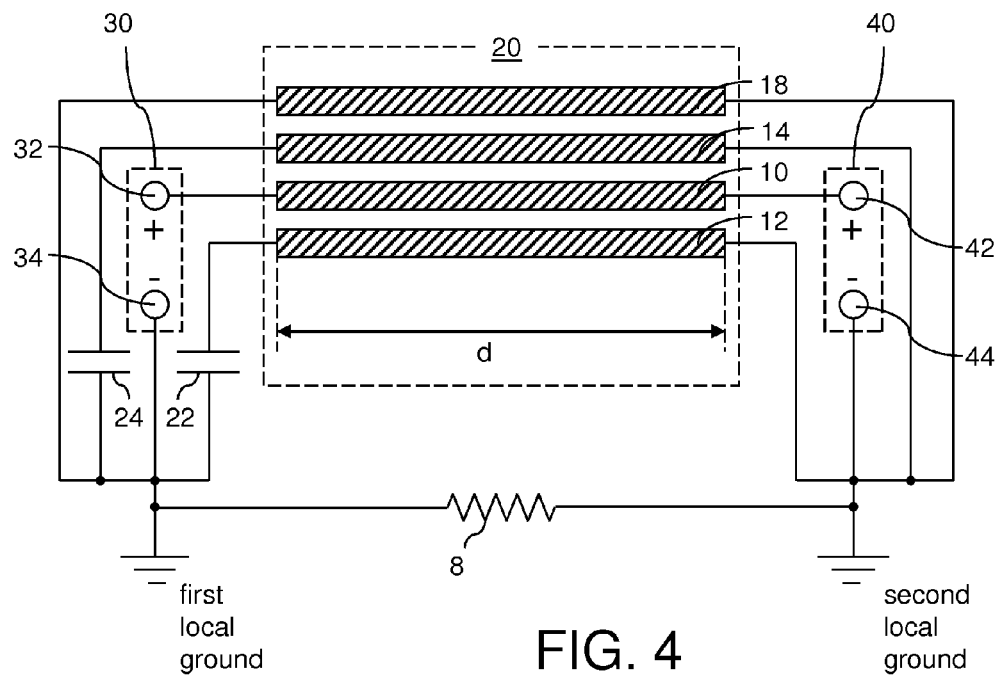
FIG. 4 is a composite view of a schematic top-down view of a set of metal lines and a circuit schematic for the rest of the components of a first exemplary inductor structure according to the present disclosure.

Referring to FIG. 4, a first exemplary inductor structure according to the present disclosure comprises a set of metal lines 20 including a signal transmission line 10, a signal transmitting device 30 including a first signal input structure represented by a first signal input node 32, and a signal receiving device 40 including a first signal receiving structure represented by a first signal output node 42. The first signal input node 32 and the first signal output node 42 can be employed as the first node N1 and the second node N2 in the circuit of FIG. 2A, respectively. In other words, the first exemplary inductor structure can be employed as the inductor with a frequency-dependent inductance of FIG. 2A by connecting one of the first signal input node 32 and the first signal output node 42 to the N1 node of the switching device of FIG. 2A and by connecting the other of the first signal input node 32 and the first signal output node 42 to the N2 node of the switching device of FIG. 2A.

An alternating current (AC) electrical signal is applied across the first signal input node 32 and a second signal input node 34, which is electrically grounded to a first local ground. The AC electrical signal may have a frequency from about 1 GHz to about 1 THz, although the structure of the present disclosure may be employed for any AC frequency. The AC electrical signal is transmitted to the signal receiving device 40 across the first signal output node 42 and a second signal output node, which is electrically grounded to a second local ground.

The term "local ground" is employed herein to denote electrical ground that is effective locally. This phenomenon occurs when the conductor material constituting the electrical ground has lesser or comparable conductivity relative to the transmission line. For example, the portion of the semiconductor constituting the first and second local electrical ground may comprise a semiconductor material which has a lower conductivity than the transmission line. In this case, the semiconductor substrate has a finite resistance between the first local ground at the signal input side and the second local ground at the signal output side. The resistance of the semiconductor substrate between the first local ground and the second local ground is represented by a resistor 8.

The set of metal lines 20 includes at least one capacitively-grounded metal line, which is serially connected to a capacitor between the first local ground and the second local ground. For example, the set of metal lines 20 may include a first capacitively-grounded metal line 12 and a second capacitively-grounded metal line 14. A serial connection of the first capacitively-grounded metal line 12 and a first capacitor 22 constitutes a first capacitively-grounded metal line structure (12, 22), and a serial connection of a second capacitively-grounded metal line 14 and a second capacitor 24 constitutes a second capacitively-grounded metal line structure (14, 24). Further, the set of metal lines 20 may include a grounded metal line 18 which is directly connected to the first local ground and the second local ground. The grounded metal line 18 is inductively coupled with the signal transmission line 10. The grounded metal line 18 is grounded to a semiconductor substrate at a first end of the grounded metal line 18 in proximity to the signal transmitting device 30. Further, the grounded metal line 18 is grounded to the semiconductor substrate at a second end of the grounded metal line 18 in proximity to the signal receiving device 40. The grounded metal line 18 functions as a ground return line for the signal transmission line 10 since the grounded metal line 18 provides a lower impedance than the resistance of the semiconductor substrate which is represented by the resistor 8.

Each of the first capacitively-grounded metal line 12, the second capacitively-grounded metal line 14, and the grounded metal line 18 is inductively coupled to the signal transmission line 10. The grounded metal line 18 is a portion of a closed circuit including the grounded metal line 18 and the resistor 8 that are connected at the first local ground and the second local ground. Thus, the mutual inductance between the grounded metal line 18 and the signal transmission line 10 affects the current flow in the signal transmission line. The length d of the metal lines (10, 12, 14, 18) may be from about 5 microns to about 10,000 microns, although lesser and greater lengths are also contemplated herein.

The effect of the first and second capacitors (22, 24) on the circuit characteristics is frequency-dependent. At a high frequency limit at which the impedances of the first and second capacitors (22, 24) approach zero, each of the first capacitively-grounded metal line structure (12, 22) and the second capacitively-grounded metal line structure (14, 24) becomes a part of a closed circuit including the resistor 8. Thus, the mutual impedance between the signal transmission line 10 and each of the first and second capacitors (22, 24) affects the current flow in the signal transmission line 10.

At a low frequency limit at which the impedances of the first and second capacitors (22, 24) approach infinity, circuits including the first capacitively-grounded metal line structure (12, 22) and the second capacitively-grounded metal line structure (14, 24) become electrically open. Thus, the mutual inductance between the signal transmission line 10 and each of the first and second capacitors (22, 24) does not affects the current flow in the signal transmission line 10.

The impedance of a capacitor having a capacitance C for a sinusoidal electrical signal is given by $1/j\omega C$, in which j is a unit of an imaginary number, $\omega$ is the angular frequency of a sinusoidal electrical signal, and C is the capacitance of the capacitor. The angular frequency $\omega$ is given by $2\pi f$, in which f is the frequency of the sinusoidal signal. The impedance of an inductor having a self-inductance L and a mutual inductance M is given by $j\omega(L+M)$. Thus, a serial connection of a capacitor and an inductor has a total impedance of $j\omega(L+M)+1/j\omega C$, which may be expressed as $j\omega(L+M)(1-1/\omega^2(L+M)C)$. The serial connection of the capacitor and the inductor functions as an inductor having an effective inductance $L'=(L+M)\{1-1/\omega^2(L+M)C\}$. When $$\omega = \sqrt{\frac{1}{(L+M)C}},$$

or $$f = \frac{1}{2\pi}\sqrt{\frac{1}{(L+M)C}},$$

the effective total inductance L', which is given by $L'=(L+M)\{1-1/\omega^2(L+M)C\}$ has divergent singularities. While parasitic effects in the physical structure prevents divergence of the effective mutual inductance L' to positive or negative infinity, the divergent singularities are preserved even with the effect of the parasitic effects.

Such characteristic of divergent singularities are present in each of the first capacitively-grounded metal line structure (12, 22) and the second capacitively-grounded metal line structure (14, 24). When the first and second capacitors (22, 24) have different capacitance values, the first capacitively-grounded metal line structure (12, 22) and the second capacitively-grounded metal line structure (14, 24) become parts of closed circuits at different frequencies. Since each of the closed circuits are in parallel connection to each other, the total impedance of the signal transmission line 10 decreases as each of the closed circuits are added. Thus, the total impedance of the signal transmission line 10 becomes more frequency-dependent than mere decrease due to the skin depth effect.

Figure 5:
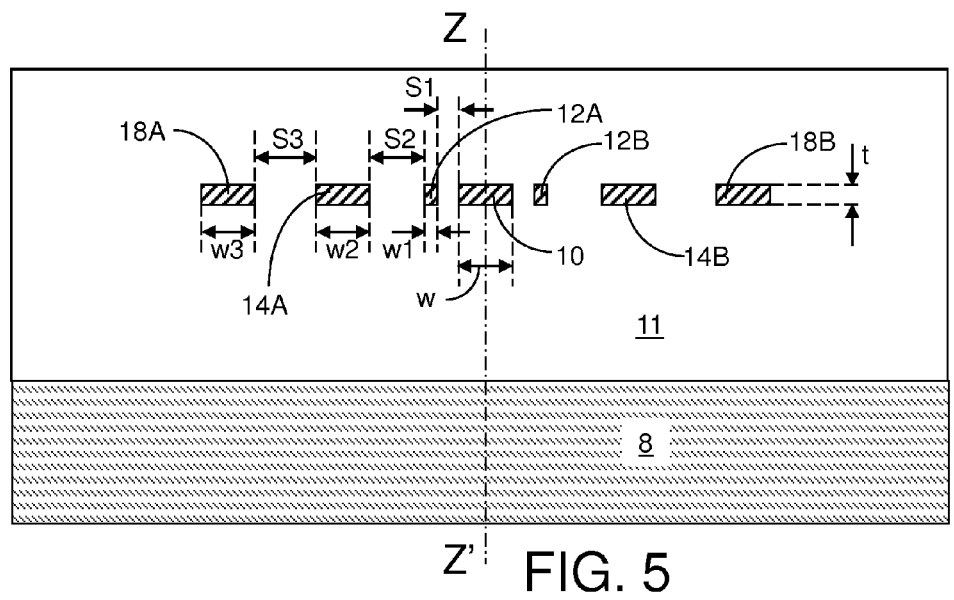
FIG. 5 is a vertical cross-sectional view of the first exemplary inductor structure according to the present disclosure.
Figure 6:
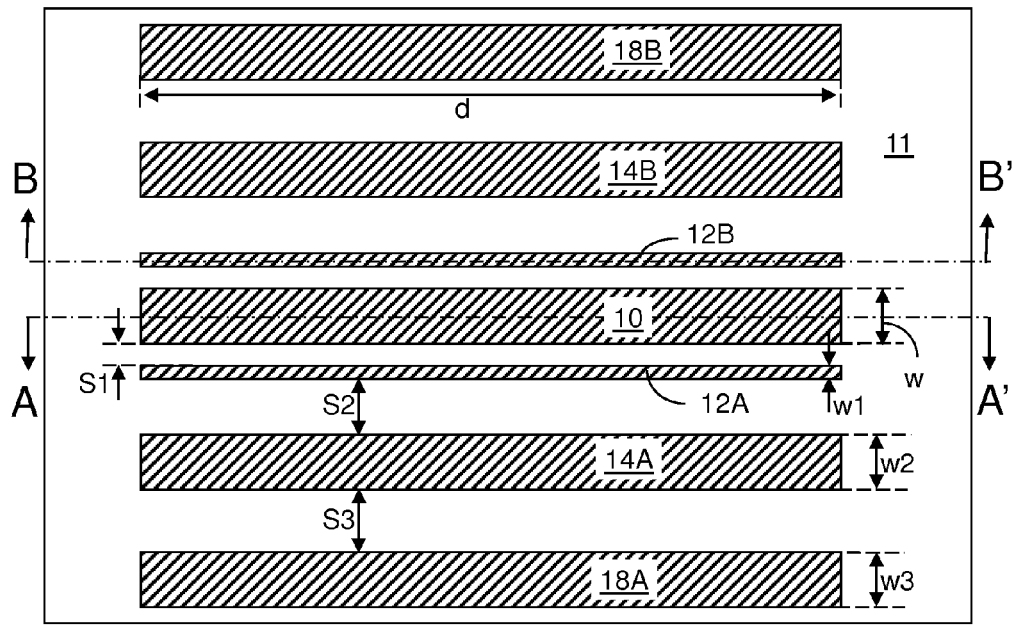
FIG. 6 is a horizontal cross-sectional view of the first exemplary inductor structure according to the present disclosure.

Referring to FIGS. 5 and 6, the first exemplary inductor structure according to the present disclosure is shown. FIG. 5 is a vertical cross-sectional view of the first exemplary inductor structure, and FIG. 6 is a horizontal cross-sectional view of the first exemplary inductor structure across a horizontal plane including the signal transmission line 10.

The first exemplary inductor structure comprises a semiconductor substrate 8 and a dielectric material layer 11. At least one semiconductor device is provided on the semiconductor substrate 8. The dielectric material layer 11 comprises at least one dielectric material. Exemplary dielectric materials that may be employed for the dielectric material layer 11 include, but are not limited to a silicate glass, an organosilicate glass (OSG) material, a SiCOH-based low-k material formed by chemical vapor deposition, a spin-on glass (SOG), or a spin-on low-k dielectric material such as SiLK™, etc. The silicate glass includes an undoped silicate glass (USG), borosilicate glass (BSG), phosphosilicate glass (PSG), fluorosilicate glass (FSG), borophosphosilicate glass (BPSG), etc. The dielectric material may be a low dielectric constant (low-k) material having a dielectric constant less than 3.0.

The dielectric material may be non-porous or porous. The dielectric material layer 11 may include a plurality of the dielectric materials described above. The dielectric materials of the dielectric material layer 11 may be formed by plasma enhanced chemical vapor deposition, high density plasma chemical vapor deposition, thermal chemical vapor deposition, spin coat and cure, etc. The thickness of the dielectric material layer 11 may be from about 0.1 μm to about 20 μm, and typically from about 1 μm to about 10 μm, although lesser and greater thicknesses are also contemplated herein.

The first exemplary inductor structure has minor symmetry around the plane Z-Z'. The signal transmission line 10 is implemented as a single line having a width w and a thickness t. The first capacitively-grounded metal line 12 of FIG. 4 is implemented as a pair of a first-side first capacitively-grounded metal line 12A and a second-side first capacitively-grounded metal line 12B, each of which has a first width w1 and are laterally spaced from the signal transmission line by a first spacing S1. The second capacitively-grounded metal line 14 of FIG. 4 is implemented as a pair of a first-side second capacitively-grounded metal line 14A and a second-side second capacitively-grounded metal line 14B, each of which has a second width w2. The first-side second capacitively-grounded metal line 14A is laterally spaced from the first-side first capacitively-grounded metal line 12A by a second spacing S2. The second-side second capacitively-grounded metal line 14B is laterally spaced from the second-side first capacitively-grounded metal line 12B by the second spacing S2. The grounded metal line 18 of FIG. 4 is implemented as a pair of a first-side grounded metal line 18A and a second-side grounded metal line 18B, each of which has a third width w3. The first-side grounded metal line 18A is laterally spaced from the first-side second capacitively-grounded metal line 14A by a third spacing S3. The second-side grounded metal line 18B is laterally spaced from the second-side second capacitively-grounded metal line 14B by the third spacing S3.

The signal transmission line 10, the first-side first capacitively-grounded metal line 12A, the second-side first capacitively-grounded metal line 12B, the first-side second capacitively-grounded metal line 14A, the second-side second capacitively-grounded metal line 14B, the first-side grounded metal line 18A, and the second-side grounded metal line 18B are located at a same level within the dielectric material layer 11, i.e., are spaced from the semiconductor substrate by a same distance.

Each of the metal lines (10, 12A, 12B, 14A, 14B, 18A, 18B) has sidewalls that are substantially parallel among one another. The sidewalls may be substantially vertical. The sidewalls are separated from one another by a substantially constant spacing. Two sidewalls belonging to a neighboring pair of metal lines are separated from each other by a portion of the dielectric material layer 11. The spacing between a sidewall of the signal transmission line 10 and sidewalls of the rest of the metal lines (12A, 12B, 14A, 14B, 18A, 18B) may be from about 0.2 micron to about 100 microns, although lesser and greater spacings are also contemplated herein.

While the present disclosure is described with exemplary inductor structures including lines located at the same level in the dielectric material layer 11, the metal lines need not be located at the same level as long as inductive coupling is proved among them. Therefore, embodiments in which the metal lines are located at different levels within the dielectric material layer 11, i.e., the vertical spacing between the metal lines and the semiconductor substrate varies from metal line to metal line, are explicitly contemplated herein.

Each of the metal lines (10, 12A, 12B, 14A, 14B, 18A, 18B) may be formed during formation of back-end-of-line (BEOL) metal interconnect structures. Particularly, each of the metal lines (10, 12A, 12B, 14A, 14B, 18A, 18B) may be formed concurrently with formation of other metal lines.

In one case, at least one of the metal lines (10, 12A, 12B, 14A, 14B, 18A, 18B) comprises electroplated copper, which consists essentially of Cu and impurities. The impurities comprise O, N, C, Cl, and S, and the total concentration of the impurities is from about 1 ppm to about 200 ppm. All of the metal lines (10, 12A, 12B, 14A, 14B, 18A, 18B) may comprise electroplated copper.

In another case, at least one of the metal lines (10, 12A, 12B, 14A, 14B, 18A, 18B) comprises an aluminum wiring structure. For example, the at least one of the metal lines (10, 12A, 12B, 14A, 14B, 18A, 18B) may comprise a vertical stack of a bottom metal nitride liner, an aluminum portion located on the bottom metal nitride liner, and a top metal nitride liner located on the aluminum portion. All of the metal lines (10, 12A, 12B, 14A, 14B, 18A, 18B) may comprise an aluminum wiring structure.

In addition, other metal interconnect materials may be employed for at least one of the metal lines (10, 12A, 12B, 14A, 14B, 18A, 18B). Such metal interconnect materials include W, WN, Ta, TaN, Ti, TiN, Au, and Ag.

Figure 7:
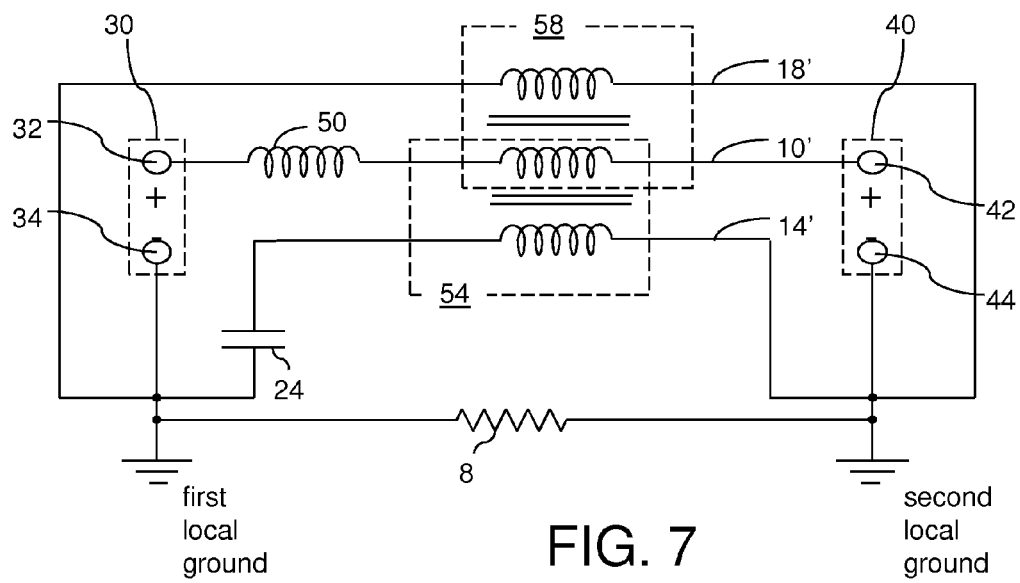
FIG. 7 is a circuit schematic of a second exemplary inductor structure according to the present disclosure.

Referring to FIG. 7, a circuit schematic of a second exemplary inductor structure according to the present disclosure is shown. The second exemplary inductor structure may be derived from the first exemplary inductor structure in FIG. 4 by removing the first capacitively-grounded metal line 12 and the first capacitor 22. The circuit schematic of the second exemplary inductor structure includes a signal transmission path 10', a second capacitively-grounded path 14', and a grounded path 18'. The first signal input node 32 and the first signal output node 42 can be employed as the first node N1 and the second node N2 in the circuit of FIG. 2A. In other words, the first exemplary inductor structure can be employed as the inductor with a frequency-dependent inductance of FIG. 2A by connecting one of the first signal input node 32 and the first signal output node 42 to the N1 node of the switching device of FIG. 2A and by connecting the other of the first signal input node 32 and the first signal output node 42 to the N2 node of the switching device of FIG. 2A.

The signal transmission path 10' includes an inductor 50 having a self-inductance L. A first mutually inductive inductor 58 having a first mutual inductance M1 is provided between the signal transmission path 10' and the grounded path 18'. A second mutually inductive inductor 54 having a second mutual inductance M2 is provided between the signal transmission path 10' and the second capacitively grounded path 14'. The signal transmission path 10' including the inductor 50 corresponds to the signal transmission line 10 of FIG. 4, the second capacitively-grounded path 14' corresponds to the second capacitively-grounded metal line 14 in FIG. 4, and the grounded path 18' corresponds to the grounded metal line 18 in FIG. 4. The second capacitively grounded path 14' and the grounded path 18' may include some self-inductance (not shown).

The first mutually inductive inductor 58 contributes a substantially frequency-independent first mutual inductance M1 to the circuit. The impedance contribution of the serial connection of the second capacitively-grounded path 14' and the second capacitor 24 is given by $M2 \times \{1-1/(\omega^2 \times M2 \times C2)\}$, wherein C2 is a second capacitance, i.e., the capacitance of the second capacitor 24.

The total impedance of the signal transmission line 10 is given by $j\omega L + j\omega M1 + j\omega M2 + 1/j\omega C2$. The characteristics of the circuit changes around the frequency at which the magnitude of the impedance $1/j\omega C2$ of the second capacitor 24 becomes equal to the sum of a first impedance jωL due to the self-inductance L and a second impedance due to the total mutual impedance jωM1+jωM2. Preferably, this frequency is within the range from about 1 GHz to about 1 THz.

The circuit of FIG. 7 may be obtained by removing the first-side and second-side first capacitively-grounded metal lines (12A, 12B) in the first exemplary inductor structure, or alternatively, by providing a first capacitor 24 which has a small enough capacitance so that the impedance of the first capacitor 24 overwhelms all other impedances in the circuit.

In general, a plurality of capacitively-grounded paths to a plurality of capacitively-grounded metal lines may be provided in a circuit so that the behavior of the circuit changes at multiple frequencies. The net effect of the frequency change is that a serial connection of a capacitively-grounded path and a capacitor may be added as a closed signal path or deactivated as an electrical open. The addition of a signal path effectively reduces the inductance of the signal transmission path 10', while deactivation of a signal path effectively increases the inductance of the signal transmission path 10'.

Figure 8:
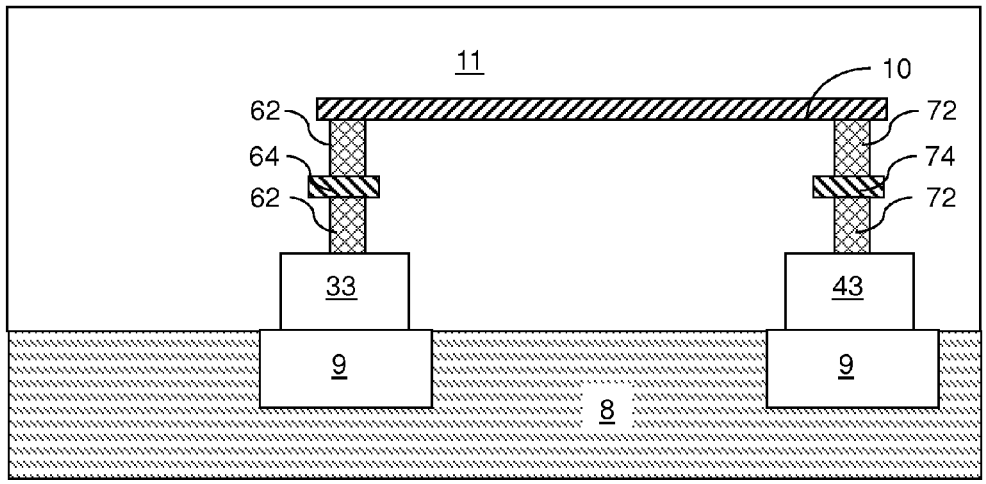
FIG. 8 is a vertical cross-sectional view of the first exemplary inductor structure along the plane A-A' in FIG. 6.

Referring to FIG. 8, a vertical cross-sectional view of the first exemplary inductor structure is shown along the plane A-A' in FIG. 6. The first exemplary inductor structure comprises the semiconductor substrate 8, which is typically a single crystalline semiconductor substrate such as an epitaxial silicon substrate.

A first signal input structure 33, which is a part of the signal transmitting device 30 of FIG. 4, is provided on the semiconductor substrate 8. The first signal input structure 33 may be electrically isolated from the semiconductor substrate 8 by a shallow trench isolation structure 9 embedded in the semiconductor substrate 8. The first signal input structure 33 functions as the first signal input node 32 of FIG. 4. The signal transmitting device 30 of FIG. 4 also includes a second signal input structure (not shown) which functions as the second signal input node 34 of FIG. 4. The second signal input structure is electrically grounded, i.e., directly abuts the semiconductor substrate 8, near the first signal input structure 33.

A first signal output structure 43, which is a part of the signal receiving device 40 of FIG. 4, is formed on the semiconductor substrate 8. The first signal output structure 43 may be electrically isolated from the semiconductor substrate 8 by another shallow trench isolation structure 9 embedded in the semiconductor substrate 8. The first signal output structure 43 functions as the first signal output node 42 of FIG. 4. The signal receiving device 40 of FIG. 4 also includes a second signal output structure (not shown) which functions as the second signal output node 44 of FIG. 4. The second signal output structure is electrically grounded, i.e., directly abuts the semiconductor substrate 8, near the first signal output structure 43.

The signal transmission line 10 is embedded in the dielectric material layer 11. The first end of the signal transmission line 10 is connected to a first assembly of vertically interconnecting structures which includes at least one first conductive via structure 62. The first assembly may include at least one first metal line structure 64. The second end of the signal transmission line 10 is connected to a second assembly of vertically interconnecting structures which includes at least one second conductive via structure 72. The second assembly may include at least one second metal line structure 74.

Figure 9:
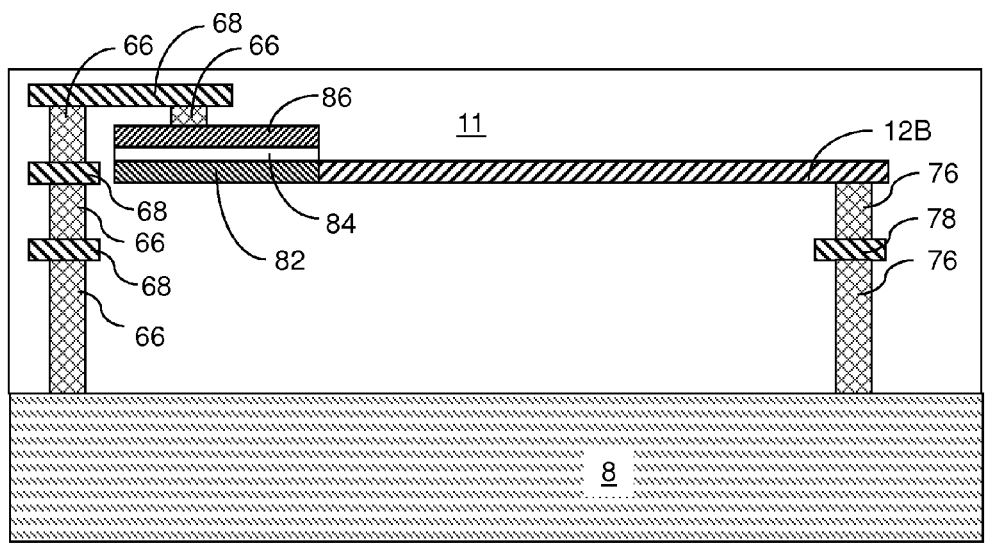
FIG. 9 is a vertical cross-sectional view of the first exemplary inductor structure according to a first embodiment of the present disclosure.

The first exemplary inductor structure may be implemented in many different physical embodiments. Referring to FIG. 9, a vertical cross-sectional view of a first embodiment of the first exemplary inductor structure is shown along the plane B-B' in FIG. 6. In the first embodiment, the first capacitor 22 is a metal-insulator-metal capacitor (MIMCAP) embedded in the dielectric material layer 11. The MIMCAP comprises a first capacitor electrode 82, a node dielectric 84, and a second capacitor electrode 86 that are vertically stacked.

The first capacitor electrode 82 is resistively connected to an end of the second-side first capacitively-grounded metal line 12B. The second capacitor electrode 86 is electrically grounded to the semiconductor substrate 8 or to a system ground node through a third assembly of vertically interconnecting structures including at least one third conductive via structure 66 embedded within the dielectric material layer 11. Alternately, the second capacitor electrode 86 may be connected to a system bus ground line that is provided as a metal interconnect structure. The third assembly may include at least one third metal line structure 68.

The other end of the second-side first capacitively-grounded metal line 12B is connected to electrical ground in proximity to the first signal output structure 43 through a fourth assembly of vertically interconnecting structures which includes at least one fourth conductive via structure 76. The second assembly may include at least one fourth metal line structure 78.

The first capacitor electrode 82 and the second-side first capacitively-grounded metal line 12B may be located in a same level within the dielectric material layer 11. In one case, the first capacitor electrode 82 and the second-side first capacitively-grounded metal line 12B may be of integral and unitary construction so that the resistance between the first capacitor electrode 82 and the second-side first capacitively-grounded metal line 12B may be minimized. In a variation of the first embodiment of the first exemplary inductor structure, the first capacitor electrode 82 and the second-side first capacitively-grounded metal line 12B may be formed at different levels.

Figure 10:
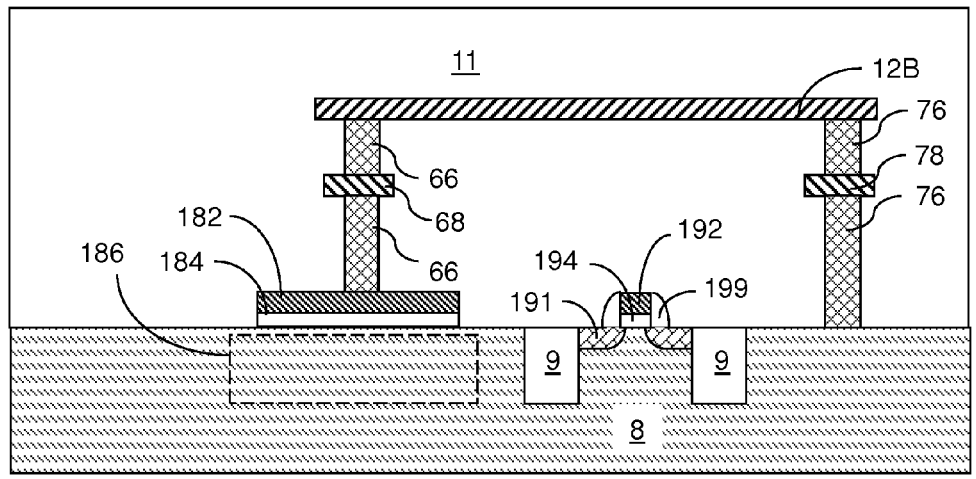
FIG. 10 is a vertical cross-sectional view of another first exemplary inductor structure according to a second embodiment of the present disclosure.

Referring to FIG. 10, a vertical cross-sectional view of a second embodiment of the first exemplary inductor structure is shown along the plane B-B' in FIG. 6. In the second embodiment, the first capacitor 22 is a planar capacitor located directly on the semiconductor substrate 8. The planar capacitor comprises a first capacitor electrode 182, a node dielectric 184, and a second capacitor electrode 186 that are vertically stacked. The second capacitor electrode 186 may be a portion of the semiconductor substrate 8.

The second embodiment may include a semiconductor device such a field effect transistor, which comprises a gate dielectric 194, a gate electrode 192, a gate spacer 199, and source and drain regions 191 that are formed within the semiconductor substrate 8. The field effect transistor (191, 192, 194, 199) may be electrically isolated from other semiconductor devices (not shown) and the signal transmitting device (not shown), and the signal receiving device (not shown) by shallow trench isolation structures 9. The gate dielectric 194 and the node dielectric 184 may comprise the same material. The gate electrode 192 and the first capacitor electrode 182 may comprise the same material. Thus, the gate dielectric 194 and the node dielectric 184 may be formed at the same processing step, and the gate electrode 192 and the first capacitor electrode 182 may be formed at the same processing step.

The first capacitor electrode 182 is resistively connected to an end of the second-side first capacitively-grounded metal line 12B through a third assembly of vertically interconnecting structures that include at least one third conductive via structure 66. The second capacitor electrode 186 is electrically grounded to the semiconductor substrate 8. The second capacitor electrode 186 may be formed in proximity to the first signal input structure (not shown). The third assembly may include at least one third metal line structure 68.

The other end of the second-side first capacitively-grounded metal line 12B is connected to electrical ground in proximity to the first signal output structure (not shown) through a fourth assembly of vertically interconnecting structures which includes at least one fourth conductive via structure 76. The fourth assembly may include at least one fourth metal line structure 78.

Figure 11:
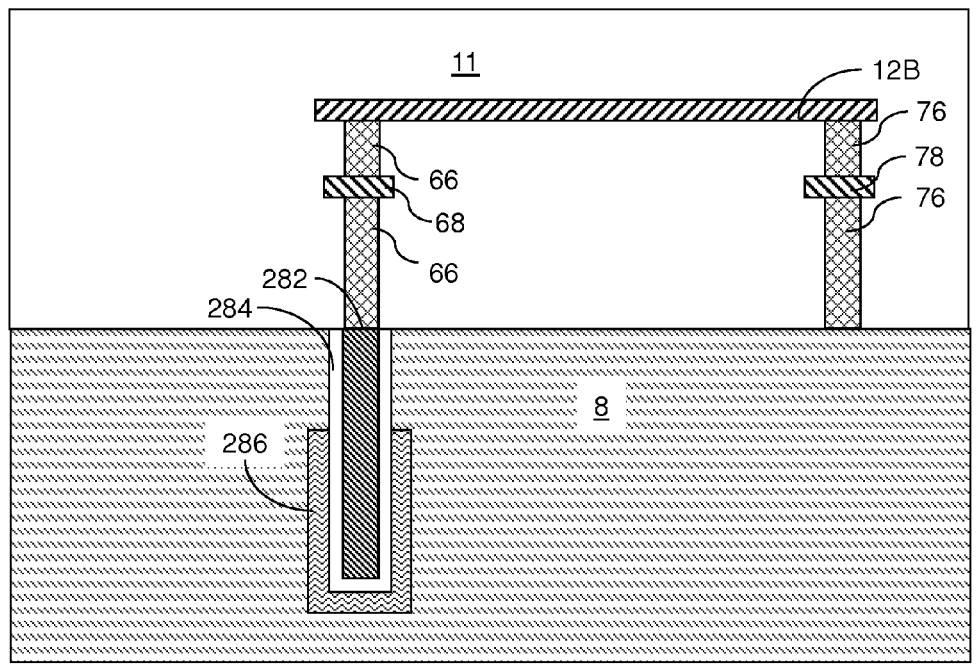
FIG. 11 is a vertical cross-sectional view of yet another first exemplary inductor structure according to a third embodiment of the present disclosure.

Referring to FIG. 11, a vertical cross-sectional view of a third embodiment of the first exemplary inductor structure is shown along the plane B-B' in FIG. 6. In the third embodiment, the first capacitor 22 is a deep trench capacitor located in the semiconductor substrate 8. The deep trench capacitor comprises a first capacitor electrode 282, a node dielectric 284, and a second capacitor electrode 286 that are laterally stacked. The second capacitor electrode 286 may be a portion of the semiconductor substrate 8.

The second capacitor electrode 286 laterally abuts and laterally surrounds sidewalls of a deep trench, which is embedded in the semiconductor substrate 8. The first capacitor electrode 282 and the node dielectric 284 are located within the deep trench.

The first capacitor electrode 282 is resistively connected to an end of the second-side first capacitively-grounded metal line 12B through a third assembly of vertically interconnecting structures that include at least one third conductive via structure 66. The second capacitor electrode 286 is electrically grounded to the semiconductor substrate 8. The second capacitor electrode 286 may be formed in proximity to the first signal input structure (not shown). The third assembly may include at least one third metal line structure 68.

The other end of the second-side first capacitively-grounded metal line 12B is connected to electrical ground in proximity to the first signal output structure (not shown) through a fourth assembly of vertically interconnecting structures which includes at least one fourth conductive via structure 76. The fourth assembly may include at least one fourth metal line structure 78.

Figure 12:
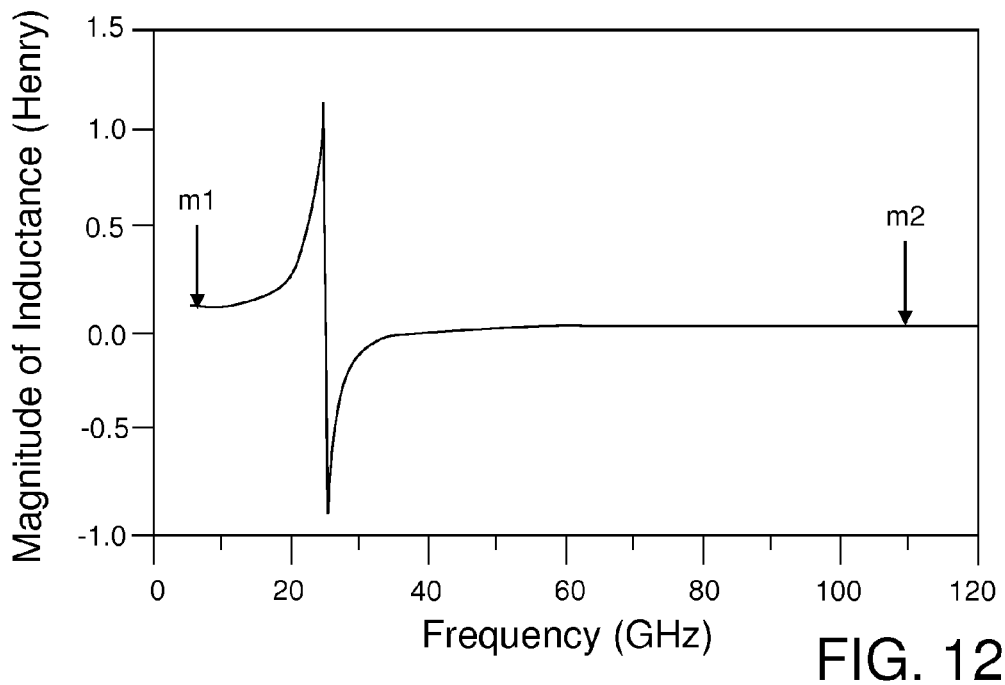
FIG. 12 is a graph showing a frequency dependence of mutual inductance of the second exemplary inductor structure.

Referring to FIG. 12, a graph shows a frequency dependence of effective inductance of the first exemplary inductor structure under a condition that approximates the second exemplary inductor structure represented by the circuit of FIG. 7. In this case, the approximation of the second exemplary inductor structure by the first exemplary inductor structure shown in FIGS. 5 and 6 is effected by disconnecting the first capacitor 22 from the first exemplary inductor structure.

In this simulation, the length d of the metal lines (10, 12A, 12B, 14A, 14B, 18A, 18B; See FIGS. 5 and 6) is set at 160 microns. The width w of the signal transmission line 10 is set at 8 microns. The first width w1 is set at 2 microns, the second width w2 is set at 8 microns, the third width w3 is set at 8 microns, and the thickness t is set at 3 microns. The first spacing S1 is set at 3 microns, the second spacing S2 is set at 8 microns, and the third spacing S3 is set at 9 microns. The value of the second capacitance C2 is set at 0.15 picoFarad (pF). Due to the absence of the first capacitor 22, the effect of the presence of the first-side and second-side first capacitively-grounded metal lines (12A, 12B) is minimal on the simulated total inductance of the signal transmission line 10.

The result of the simulation shows that the total inductance of the signal transmission line 10 is about 0.131 Henry at 6 GHz (marked with a pointer labeled "m1"), and about 0.038 Henry at about 110 GHz (marked with a pointer labeled "m2"). In the absence of the second capacitance C2, the total inductance is determined by the self-inductance of the signal transmission line 10 and the mutual inductance due to the first-side and second-side grounded metal lines (18A, 18B) without the effect of the first-side and second side second capacitively-grounded metal lines (14A, 14B). In this case, the total inductance is expected to be about the same at 6 GHz, but is expected to be about 0.118 Henry at about 110 GHz. Thus, the presence of the first-side and second side second capacitively-grounded metal lines (14A, 14B) and the second capacitor 22 having the second capacitance of 0.15 pF reduces the total inductance of the signal transmission line by a factor of about 68%.

Figure 13:
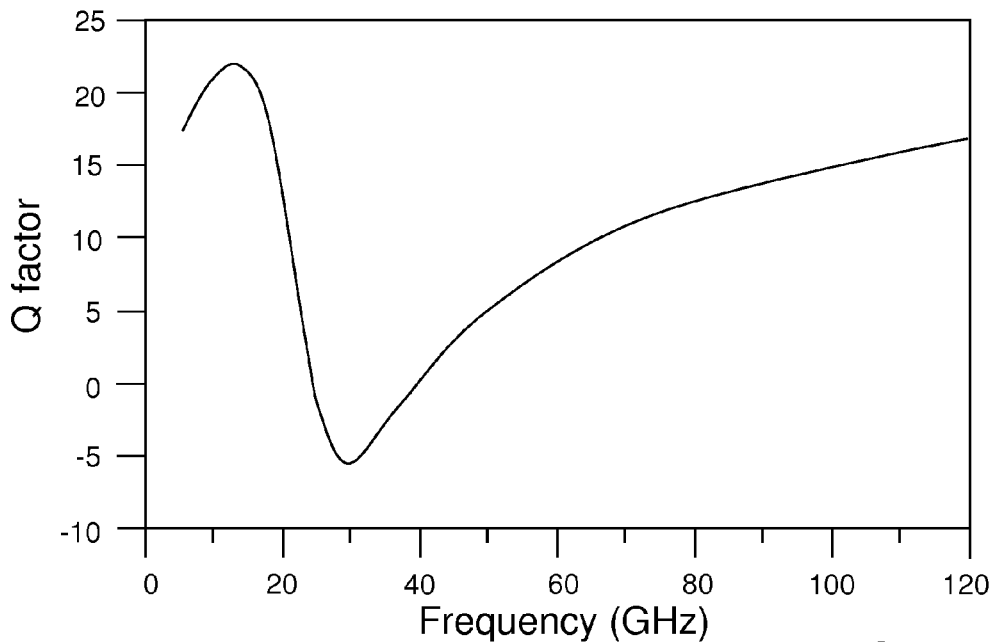
FIG. 13 is a graph showing a frequency dependence of Q factor of the second exemplary inductor structure.

FIG. 13 is a graph showing a frequency dependence of Q factor of the first exemplary inductor structure under the same condition as in FIG. 12. Any frequency range having a Q-factor greater than 10 is usable for signal transmission. Thus, a first frequency range from about 6 GHz to about 20 GHz and a second frequency range from about 65 GHz to at least about 120 GHz are usable for signal transmission.

Figure 14:
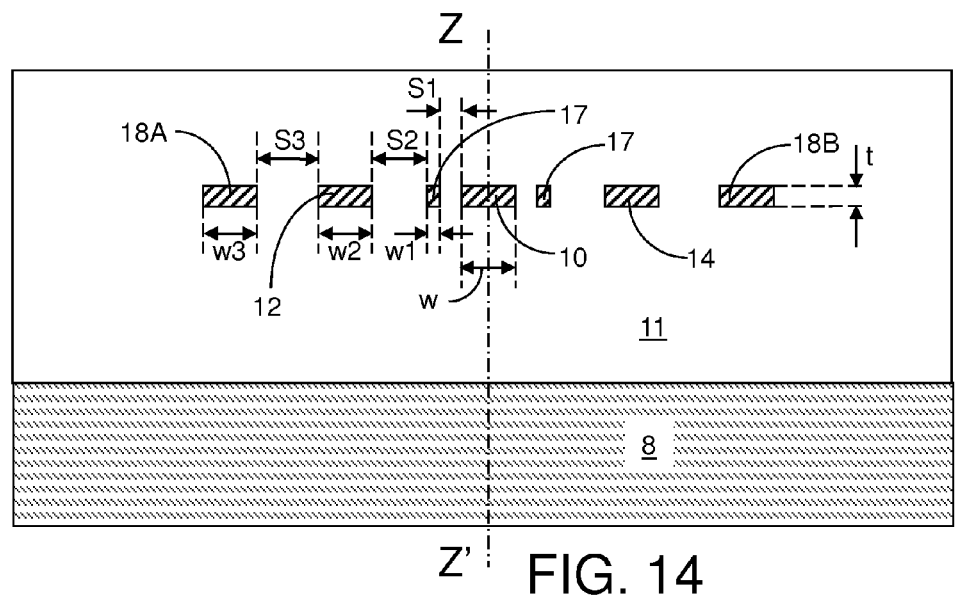
FIG. 14 is a vertical cross-sectional view of a third exemplary inductor structure according to the present disclosure.
Figure 15:
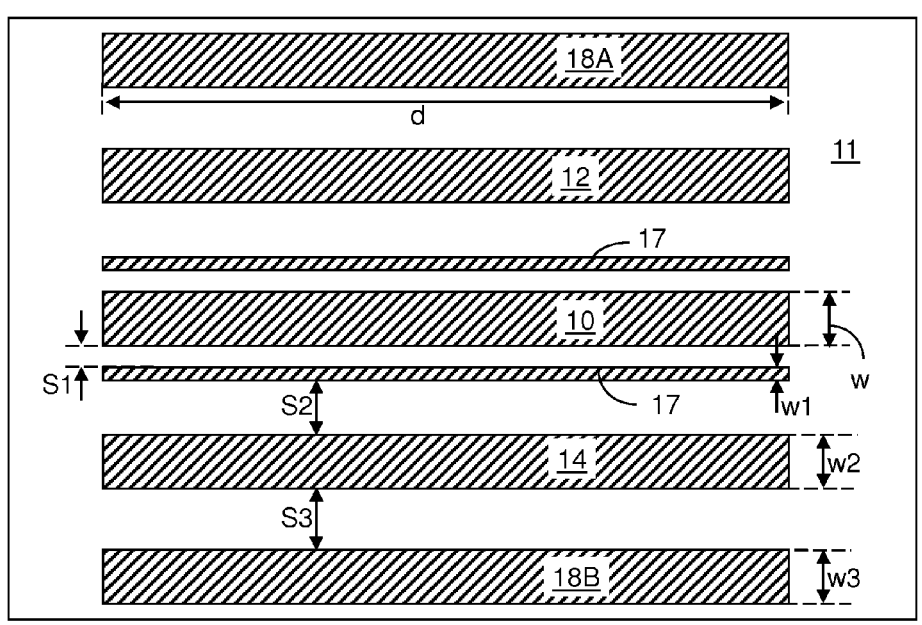
FIG. 15 is a horizontal cross-sectional view of the third exemplary inductor structure according to the present disclosure.

Referring to FIGS. 14 and 15, a third exemplary inductor structure according to the present disclosure is shown. FIG. 14 is a vertical cross-sectional view of the third exemplary inductor structure, and FIG. 15 is a horizontal cross-sectional view of the third exemplary inductor structure across a horizontal plane including a signal transmission line 10.

The third exemplary inductor structure comprises a semiconductor substrate 8 and a dielectric material layer 11, which are the same as in the first exemplary inductor structure. The first exemplary inductor structure has mirror symmetry around the plane Z-Z' as far as metal lines are concerned. However, the metal lines are wired in a different manner from the first exemplary inductor structure. Further, different capacitors are employed.

The first exemplary inductor structure includes a signal transmission line 10 having a width w and a thickness t, a pair of electrically disconnected lines 17 having a first width w1, a first capacitively-grounded metal line 12 having a second width w2, a second capacitively-grounded metal line 14 having the second width w2, and a pair of a first-side grounded metal line 18A and a second-side grounded metal line 18B, each having a third width w3. Each of the electrically disconnected lines 17 is spaced from the signal transmission line 10 by a first spacing S1. Each of the first capacitively-grounded metal line 12 and the second capacitively-grounded metal line 14 is spaced from an electrically disconnected line 17 by a second spacing S2. The first-side grounded metal line 18A is laterally spaced from the first capacitively-grounded metal line 12 by a third spacing S3. The second-side grounded metal line 18B is laterally spaced from the second capacitively-grounded metal line 14 by the third spacing S3. All metal lines (10, 17, 12, 14, 18A, 18B) have a length d, and a thickness t.

The pair of electrically disconnected line 17 are electrically disconnected, i.e., not connected to any other electrical component. The first capacitively-grounded metal line 12 is grounded through a first capacitor (not shown), which may be the same as the first capacitor 22 in FIG. 4. The second capacitively-grounded metal line 14 is grounded through a second capacitor (not shown), which may be the same as the second capacitor 24 in FIG. 4. Each of the first-side grounded metal line 18A and the second-side grounded metal line 18B is electrically grounded in the same manner as the grounded metal line 18 in FIG. 4.

Figure 16:
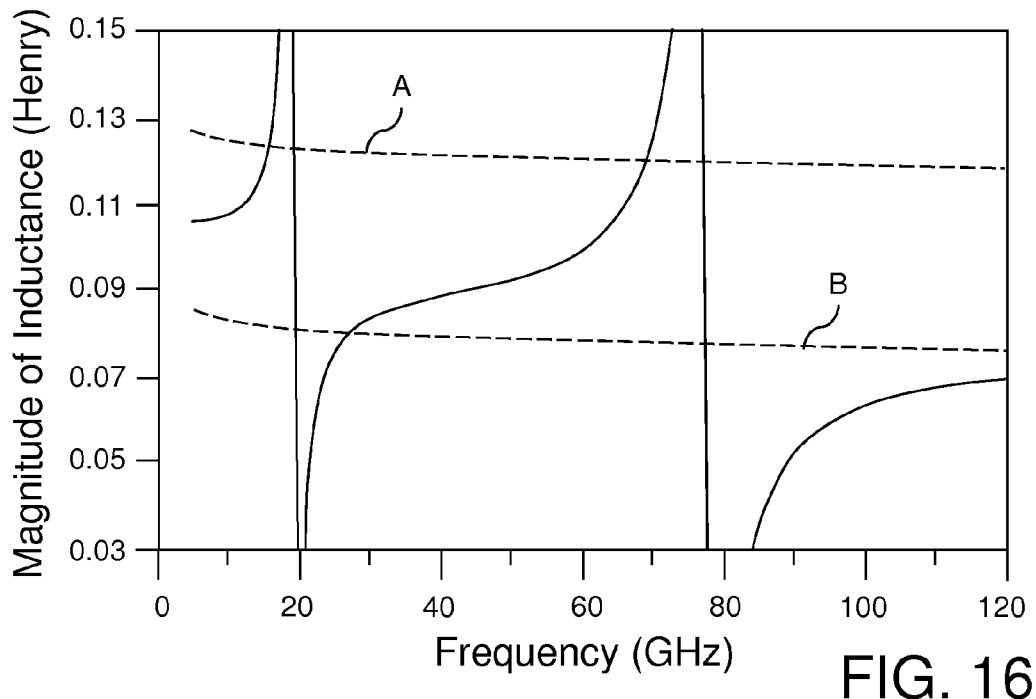
FIG. 16 is a graph showing a frequency dependence of the inductance of the third exemplary inductor structure.

Referring to FIG. 16, a graph shows a frequency dependence of effective mutual inductance of the third exemplary inductor structure under a simulation condition. Specifically, the length d of the metal lines (10, 17, 12, 14, 18A, 18B; See FIGS. 14 and 15) is set at 160 microns. The width w of the signal transmission line 10 is set at 8 microns. The first width w1 is set at 2 microns, the second width w2 is set at 8 microns, the third width w3 is set at 8 microns, and the thickness t is set at 3 microns. The first spacing S1 is set at 3 microns, the second spacing S2 is set at 8 microns, and the third spacing S3 is set at 9 microns. The value of the first capacitance for the first capacitor, which is attached to the first capacitively-grounded metal line 12, is set at 0.05 pF. The value of the second capacitance for the second capacitor, which is attached to the second capacitively-grounded metal line 14, is set at 0.50 pF. Due to the two different values of the capacitance, the first and second capacitors introduce divergent singularities in the total inductance of the signal transmission line at different frequencies.

The result of the simulation, displayed in a solid line, shows that the total inductance of the signal transmission line 10 displays three plateaus at three different frequency ranges. Dotted line A corresponds to a hypothetical case in which the first capacitively-grounded metal line 12 and the second capacitively-grounded metal line 14 are electrically disconnected. Dotted line B corresponds to another hypothetical case in which the first capacitor and the second capacitor are replaced with a direct connection, i.e., the first capacitively-grounded metal line 12 and the second capacitively-grounded metal line 14 are directly grounded.

Figure 17:
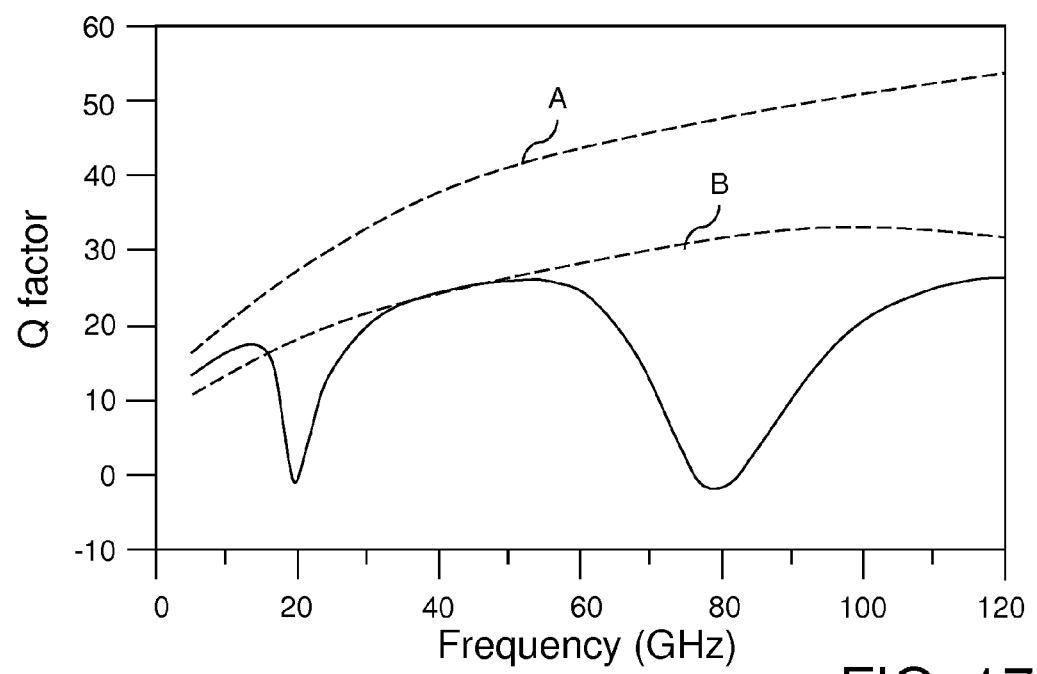
FIG. 17 is a graph showing a frequency dependence of Q factor of the third exemplary inductor structure.

FIG. 17 is a graph showing a frequency dependence of Q factor of the first exemplary inductor structure under the same condition as in FIG. 16. Since any frequency range having a Q-factor greater than 10 is usable for signal transmission, a first frequency range from about 6 GHz to about 16 GHz and a second frequency range from about 24 GHz to about 65 GHz, and a third frequency range from about 90 GHz to at least about 120 GHz are usable for signal transmission. Within each usable frequency range, a different total inductance value is provided for the signal transmission line 10.

Figure 18:
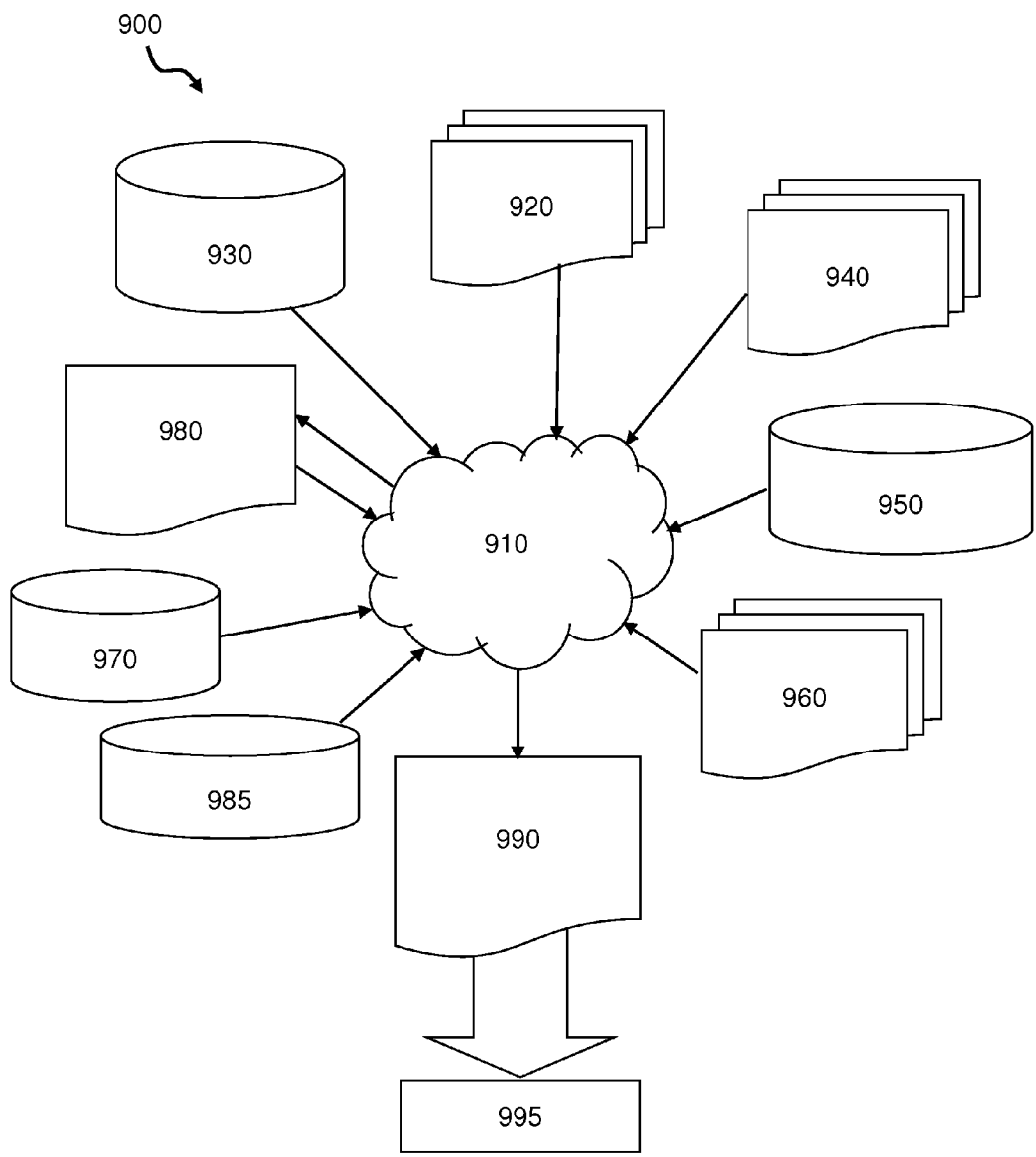
FIG. 18 is a flow diagram of a design process that may be used in design and manufacture of the semiconductor circuits according to the present disclosure.

FIG. 18 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 2-17. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 18 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-17. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-17 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium is a non-transitory medium in which data can be stored permanently or until destruction of the medium. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the disclosure. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the disclosure shown in FIGS. 2-17. In one embodiment, design structure 990 may comprise a compiled, executable HDL simulation model that functionally simulates the devices shown in FIGS. 2-17.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-17. Design structure 990 may then proceed to a stage 995 where, for example, design structure 990: proceeds to tape-out, is released to manufacturing, is released to a mask house, is sent to another design house, is sent back to the customer, etc.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A structure comprising a switching device and an inductor structure, wherein a first node of said inductor structure is electrically connected to an input node of said switching device for receiving an input signal having an input frequency and a second node of said inductor structure is electrically connected to an output node of said switching device, wherein said inductor structure has a frequency-dependent inductance and a value of said frequency-dependent inductance varies with the input frequency.

2. The structure of claim 1, wherein an inductive impedance component due to said frequency-dependent inductance matches a capacitive impedance component due to a parasitic capacitance of said switching device at a plurality of frequencies.

3. The structure of claim 2, wherein said plurality of frequencies includes a first frequency and a second frequency that is greater than said first frequency, and said frequency-dependent inductance is greater at said first frequency than at said second frequency.

4. The structure of claim 1, wherein said switching device is a field effect transistor configured to transmit or electrically isolate a signal at a frequency greater than 30 GHz.

5. The structure of claim 4, wherein said first node is electrically connected to one of a source and a drain of said field effect transistor, and said second node is electrically connected to the other of said source and said drain of said field effect transistor.

6. The semiconductor circuit of claim 4, wherein said first node is electrically connected to one of a source and a drain of said field effect transistor, and said second node is electrically connected to the other of said source and said drain of said field effect transistor.

7. A structure comprising a switching device and an inductor structure, wherein a first node of said inductor structure is electrically connected to an input node of said switching device and a second node of said inductor structure is electrically connected to an output node of said switching device, wherein said inductor structure has a frequency-dependent inductance, wherein said inductor structure comprises:
   a first metal line embedded in a dielectric material layer located on a semiconductor substrate and resistively connected to a first device at a first end of said first metal line and resistively connected to a second device at a second end of said first metal line;
   a second metal line embedded in said dielectric material layer and inductively coupled with said first metal line through a portion of said dielectric material layer; and
   a capacitor having a first capacitor electrode and a second capacitor electrode, wherein said first capacitor electrode is resistively connected to an end of said second metal line, and wherein said second capacitor electrode is electrically grounded.

8. The structure of claim 7, wherein said first device is a signal transmitting device and said second device is a signal receiving device and said first metal line is a signal transmission line.

9. The structure of claim 8, wherein said first device includes a first signal input node structure directly connected to said first end of said first metal line and a second signal input node structure directly connected to said semiconductor substrate, and wherein said second device includes a first signal output node structure directly connected to said second end of said first metal line and a second signal output node structure directly connected to said semiconductor substrate.

10. The structure of claim 7, wherein a magnitude of impedance of said capacitor is equal to a magnitude of a sum of a first impedance due to self-inductance of said first metal line and second impedance due to mutual inductance between said first metal line and said second metal line within a frequency range between 1 GHz and 1 THz.

11. The structure of claim 7, wherein said first metal line and said second metal line are located at a same level within said dielectric material layer and spaced from said semiconductor substrate by a same distance.

12. A semiconductor circuit comprising a switching device and an inductor structure having a frequency-dependent inductance, wherein a first node of said inductor structure is electrically connected to an input node of said switching device for receiving an input signal having an input frequency and a second node of said inductor structure is electrically connected to an output node of said switching device; and wherein a value of said frequency-dependent inductance varies with the input frequency.

13. The semiconductor circuit of claim 12, wherein an inductive impedance component due to said frequency-dependent inductance matches a capacitive impedance component due to a parasitic capacitance of said switching device at a plurality of frequencies.

14. The semiconductor circuit of claim 13, wherein said plurality of frequencies includes a first frequency and a second frequency that is greater than said first frequency, and said frequency-dependent inductance is greater at said first frequency than at said second frequency.

15. The semiconductor circuit of claim 12, wherein said switching device is a field effect transistor configured to transmit or electrically isolate a signal at a frequency greater than 30 GHz.

16. A computer-program product comprising a computer-readable storage medium for containing instructions that, if executed on a computing device, defines a design structure comprising:
 a first data representing a switching device; and
 a second data representing an inductor structure, wherein a first node of said inductor structure is electrically connected to an input node of said switching device and a second node of said inductor structure is electrically connected to an output node of said switching device for receiving an input signal having an input frequency, wherein said inductor structure has a frequency-dependent inductance and a value of said frequency-dependent inductance varies with the input frequency.

17. The machine readable medium of claim 16, wherein an inductive impedance component due to said frequency-dependent inductance matches a capacitive impedance component due to a parasitic capacitance of said switching device at a plurality of frequencies.

18. The machine readable medium of claim 17, wherein said plurality of frequencies includes a first frequency and a second frequency that is greater than said first frequency, and said frequency-dependent inductance is greater at said first frequency than at said second frequency.

19. The machine readable medium of claim 16, wherein said switching device is a field effect transistor configured to transmit or electrically isolate a signal at a frequency greater than 30 GHz.

20. The machine readable medium of claim 19, wherein said first node is electrically connected to one of a source and a drain of said field effect transistor, and said second node is electrically connected to the other of said source and said drain of said field effect transistor.

21. A computer-program product comprising a computer-readable storage medium for containing instructions that, if executed on a computing device, defines a design structure comprising:
 a first data representing a switching device; and
 a second data representing an inductor structure, wherein a first node of said inductor structure is electrically connected to an input node of said switching device and a second node of said inductor structure is electrically connected to an output node of said switching device for receiving an input signal having an input frequency, wherein said inductor structure has a frequency-dependent inductance and a value of said frequency-dependent inductance varies with the input frequency, wherein said second data comprises:
 a third data representing a dielectric material layer located on a semiconductor substrate;
 a fourth data representing a first metal line embedded in said dielectric material layer;
 a fifth data representing a second metal line embedded in said dielectric material layer and inductively coupled with said first metal line through a portion of said dielectric material layer; and
 a sixth data representing a capacitor having a first capacitor electrode and a second capacitor electrode, wherein said first capacitor electrode is resistively connected to an end of said second metal line, and wherein said second capacitor electrode is electrically grounded.

22. The machine readable medium of claim 21, further comprising:
 a seventh data representing a first device located on said semiconductor substrate, wherein a first end of said first metal line is resistively connected to said first device; and
 an eighth data representing a second device located on said semiconductor substrate, wherein a second end of said first metal line is resistively connected to said second device.

23. The machine readable medium of claim 22, wherein said seventh data represents a signal transmitting device and said eighth data represents a signal receiving device and said second data represents a signal transmission line.

24. The machine readable medium of claim 23, wherein said seventh data includes a ninth data representing a first signal input node structure directly connected to said first end of said first metal line and an tenth data representing a second signal input node structure directly connected to said semiconductor substrate, and wherein said eighth data includes a eleventh data representing a first signal output node structure directly connected to said second end of said first metal line and a twelfth data representing a second signal output node structure directly connected to said semiconductor substrate.

25. The machine readable medium of claim 21, wherein said sixth data represents a capacitor having an impedance, wherein a magnitude of said impedance is equal to a magnitude of a sum of a first impedance due to self-inductance of said first metal line and a second impedance due to mutual inductance between said first metal line and said second metal line within a frequency range between 1 GHz and 1 THz.

* * * * *